(12) United States Patent
Nakada et al.

(10) Patent No.: US 11,204,373 B2
(45) Date of Patent: Dec. 21, 2021

(54) ELECTRIC POWER CONVERTING APPARATUS

(71) Applicant: Mitsubishi Electric Corporation, Tokyo (JP)

(72) Inventors: Muneki Nakada, Tokyo (JP); Shuichi Ueno, Tokyo (JP); Satoshi Ishii, Tokyo (JP); Tomonori Yamada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 4 days.

(21) Appl. No.: 16/774,239

(22) Filed: Jan. 28, 2020

(65) Prior Publication Data

US 2020/0271696 A1    Aug. 27, 2020

(30) Foreign Application Priority Data

Feb. 27, 2019   (JP) .............................. JP2019-034101

(51) Int. Cl.
*G01R 15/20* (2006.01)
*H02M 7/00* (2006.01)
(Continued)

(52) U.S. Cl.
CPC .......... *G01R 15/207* (2013.01); *H01F 27/24* (2013.01); *H02G 5/02* (2013.01); *H02M 7/003* (2013.01);
(Continued)

(58) Field of Classification Search
CPC ...... G01R 15/207; H01F 27/24; H02M 7/003; H02M 7/53871; H02M 3/158; H05K 1/181; H05K 2201/10151
(Continued)

(56) References Cited

U.S. PATENT DOCUMENTS 9,915,685 B2 *  3/2018  Nomura ............... G01R 15/207
2018/0350515 A1 * 12/2018  Okamoto ............. H01F 27/402

FOREIGN PATENT DOCUMENTS

JP         63-61170 A     3/1988
JP       2012-163401 A    8/2012
(Continued)

OTHER PUBLICATIONS

Communication dated Mar. 17, 2020, issued by the Japan Patent Office in application No. 2019-034101.

*Primary Examiner* — Yemane Mehari
(74) *Attorney, Agent, or Firm* — Sughrue Mion, PLLC; Richard C. Turner

(57) ABSTRACT

In the electric power converting apparatus, an electric current sensor that measures an electric current that flows through a busbar includes: a magnetic flux concentrating core that has a first end portion and a second end portion that face each other so as to have a measuring space interposed; and a magnetoelectric transducer that has a magnetically sensitive portion that is disposed in the measuring space. The magnetoelectric transducer generates a signal in response to a magnitude of a magnetic field that is sensed by the magnetically sensitive portion. Where a core opening direction of the magnetic flux concentrating core is a direction that is directed from the busbar, through the measuring space, and outward from the magnetic flux concentrating core, a direction of the magnetic leakage field at the electric reactor is a direction that is different than the core opening direction.

6 Claims, 17 Drawing Sheets

(51) Int. Cl.
*H02G 5/02* (2006.01)
*H05K 1/18* (2006.01)
*H01F 27/24* (2006.01)
*H02M 3/158* (2006.01)
*H02M 7/5387* (2007.01)

(52) U.S. Cl.
CPC ............ *H05K 1/181* (2013.01); *H02M 3/158* (2013.01); *H02M 7/53871* (2013.01); *H05K 2201/10151* (2013.01)

(58) Field of Classification Search
USPC .......................................................... 363/13
See application file for complete search history.

(56) References Cited

FOREIGN PATENT DOCUMENTS

| | | | | |
|---|---|---|---|---|
| JP | 2015194472 A | * | 11/2015 | ........... G01R 15/207 |
| JP | 2017-204981 A | | 11/2017 | |
| JP | 6472561 B1 | * | 6/2018 | .............. H02M 7/48 |
| JP | 2018-207621 A | | 12/2018 | |
| JP | 6472561 B1 | | 2/2019 | |

\* cited by examiner

ELECTRIC POWER CONVERTING APPARATUS

BACKGROUND OF THE INVENTION

1. Field of the Invention

The present invention relates to an electric power converting apparatus that includes an electric current sensor that measures electric current that flows through a busbar.

2. Description of the Related Art

Conventionally, electric power converting apparatuses are known in which electric current that flows through a busbar is measured by an electric current sensor in order to control output electric power to a motor. In conventional electric power converting apparatuses of this kind, a magnetoelectric transducer that outputs a signal in response to the magnitude of a magnetic field may be used as the electric current sensor. The electric current that flows through the busbar is measured by the magnetoelectric transducer outputting the signal in response to the magnitude of the magnetic field that arises around the busbar.

At the same time, in conventional electric power converting apparatuses, an electric reactor can be used in order to suppress electric current pulsation. Consequently, if a magnetoelectric transducer is disposed in a vicinity of the electric reactor, then the magnetoelectric transducer measures the magnetic leakage field leaking out from the electric reactor, and there is a risk that measurement errors in the electric current sensor may increase.

Conventionally, electric power converting apparatuses have been proposed in which orientation of a magnetoelectric transducer is adjusted relative to an electric reactor such that a magnetic leakage field from the electric reactor passes though in a direction that is perpendicular to a direction of magnetic sensitivity of the magnetoelectric transducer in order to suppress increases in measurement errors in an electric current sensor (see Patent Literature 1, for example).

CITATION LIST

Patent Literature

[Patent Literature 1]
Japanese Patent Laid-Open No. 2017-204981 (Gazette)

However, in the conventional electric power converting apparatus that is disclosed in Patent Literature 1, a magnetic flux concentrating core that concentrates a magnetic field in the magnetoelectric transducer is not included in the electric current sensor. Consequently, it is necessary to increase the sensitivity of the magnetoelectric transducer to magnetic fields. If the sensitivity of the magnetoelectric transducer to magnetic fields is increased, then external disturbances that are detected by the magnetoelectric transducer increase, making it necessary to add retrofitted parts such shielding, etc. Costs for the electric power converting apparatus are thereby increased.

If, on the other hand, an electric current sensor in which a magnetoelectric transducer and a magnetic flux concentrating core are combined is used to measure the electric current in the busbar, then the magnetic leakage field from the electric reactor passes through the magnetic flux concentrating core and is more likely to reach the magnetoelectric transducer, and there is a risk that measurement errors in the electric current sensor may increase.

SUMMARY OF THE INVENTION

The present invention aims to solve the above problems and an object of the present invention is to provide an electric power converting apparatus that can suppress measurement errors in an electric current sensor that includes a magnetoelectric transducer and a magnetic flux concentrating core.

An electric power converting apparatus according to the present invention includes: a busbar; an electric reactor; and an electric current sensor that is disposed in a range that is reached by a magnetic leakage field that leaks out from the electric reactor, the electric current sensor measuring an electric current that flows through the busbar, wherein: the electric current sensor includes: a magnetic flux concentrating core that has a first end portion and a second end portion that face each other so as to have a measuring space interposed; and a magnetoelectric transducer that has a magnetically sensitive portion that is disposed in the measuring space, the magnetoelectric transducer generating a signal in response to a magnitude of a magnetic field that is sensed by the magnetically sensitive portion; and where a core opening direction of the magnetic flux concentrating core is a direction that is directed from the busbar, through the measuring space, and outward from the magnetic flux concentrating core, a direction of the magnetic leakage field at the electric reactor is a direction that is different than the core opening direction.

According to the electric power converting apparatus according to the present invention, measurement errors in the electric current sensor that includes the magnetoelectric transducer and the magnetic flux concentrating core can be suppressed.

DETAILED DESCRIPTION OF THE PREFERRED EMBODIMENTS

Preferred embodiments of the present invention will now be explained with reference to the drawings.

Embodiment 1

Figure 1:
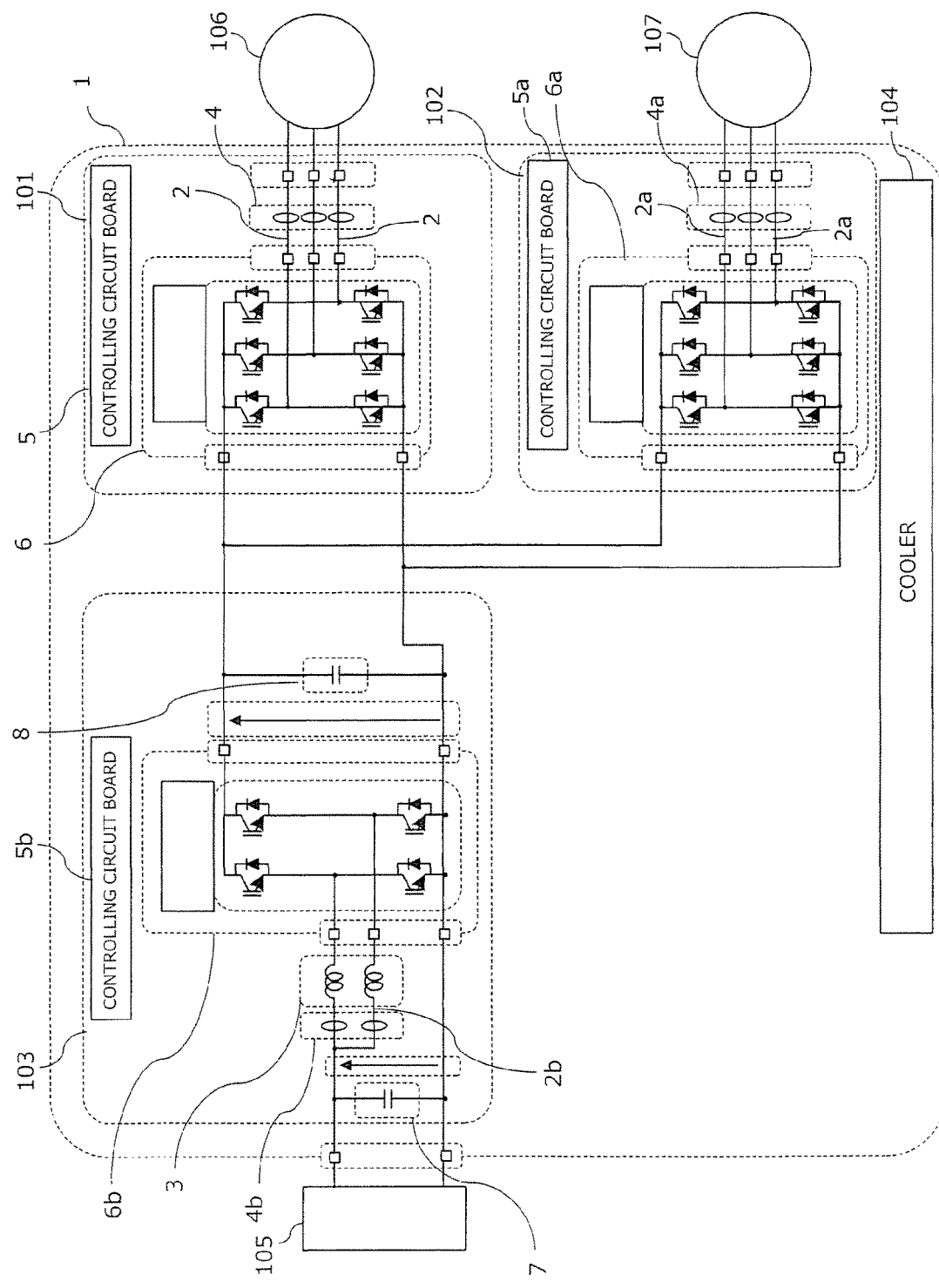
FIG. 1 is a circuit diagram for an electric power converting apparatus according to Embodiment 1 of the present invention.

FIG. 1 is a circuit diagram for an electric power converting apparatus according to Embodiment 1 of the present invention. An electric power converting apparatus 1 is a device that converts electrical energy between an electric power supply and a load. In this example, an automotive electric power converting apparatus that is mounted to a vehicle such as a hybrid vehicle, or an electric vehicle, etc., is used as the electric power converting apparatus 1.

The electric power converting apparatus 1 is an electric power converting apparatus that includes a first inverter 101, a second inverter 102, a converter 103, and a cooler 104. The first inverter 101, the second inverter 102, and the converter 103 are cooled by the cooler 104.

The converter 103 is electrically connected to a battery 105. A high-voltage secondary battery is used as the battery 105. The first inverter 101 and the second inverter 102 are both electrically connected to the converter 103. The first inverter 101 is electrically connected to the motor 106. The second inverter 102 is electrically connected to a generator 107.

An output direct-current voltage of the battery 105 is stepped up by the converter 103. The direct-current voltage that has been stepped up by the converter 103 is converted to an alternating-current voltage by the first inverter 101. The motor 106 is driven by the alternating-current voltage that has been converted by the first inverter 101.

An alternating-current voltage that is generated by the generator 107 is converted to a direct-current voltage by the second inverter 102. The direct-current voltage that is converted by the second inverter 102 is stepped down by the converter 103. The direct-current voltage that has been stepped down by the converter 103 is regenerated to the battery 105.

The first inverter 101 includes a plurality of busbars 2, a plurality of electric current sensors 4, a controlling circuit board 5, and an intelligent power module (IPM) 6.

The intelligent power module 6 is electrically connected to the motor 106 by means of the plurality of busbars 2. The plurality of electric current sensors 4 measure the electric currents that flow through the plurality of busbars 2 separately. The controlling circuit board 5 controls the electric currents that flow through the respective busbars 2 by controlling the operation of the intelligent power module 6 based on information from the results of measurement of each of the electric current sensors 4.

The second inverter 102 includes a plurality of busbars 2a, a plurality of electric current sensors 4a, a controlling circuit board 5a, and an intelligent power module 6a.

The intelligent power module 6a is electrically connected to the generator 107 by means of the plurality of busbars 2a. The plurality of electric current sensors 4a measure the electric currents that flow through the plurality of busbars 2a separately. The controlling circuit board 5a controls the electric currents that flow through the respective busbars 2a by controlling the operation of the intelligent power module 6a based on information from the results of measurement of each of the electric current sensors 4a.

The converter 103 includes a plurality of busbars 2b, an electric reactor 3, a plurality of electric current sensors 4b, a controlling circuit board 5b, an intelligent power module 6b, a primary smoothing capacitor 7, and a secondary smoothing capacitor 8.

The intelligent power module 6b is electrically connected to the battery 105 by means of the plurality of busbars 2b. The electric reactor 3 is connected to the plurality of busbars 2b. The electric reactor 3 suppresses pulsation in the electric currents that flow through the respective busbars 2b. The plurality of electric current sensors 4b measure the electric currents that flow through the plurality of busbars 2b separately. The controlling circuit board 5b controls the electric currents that flow through the respective busbars 2b by controlling the operation of the intelligent power module 6b based on information from the results of measurement of each of the electric current sensors 4b. The primary smoothing capacitor 7 is connected to a primary side of the intelligent power module 6b. The secondary smoothing capacitor 8 is connected to a secondary side of the intelligent power module 6b.

Figure 2:
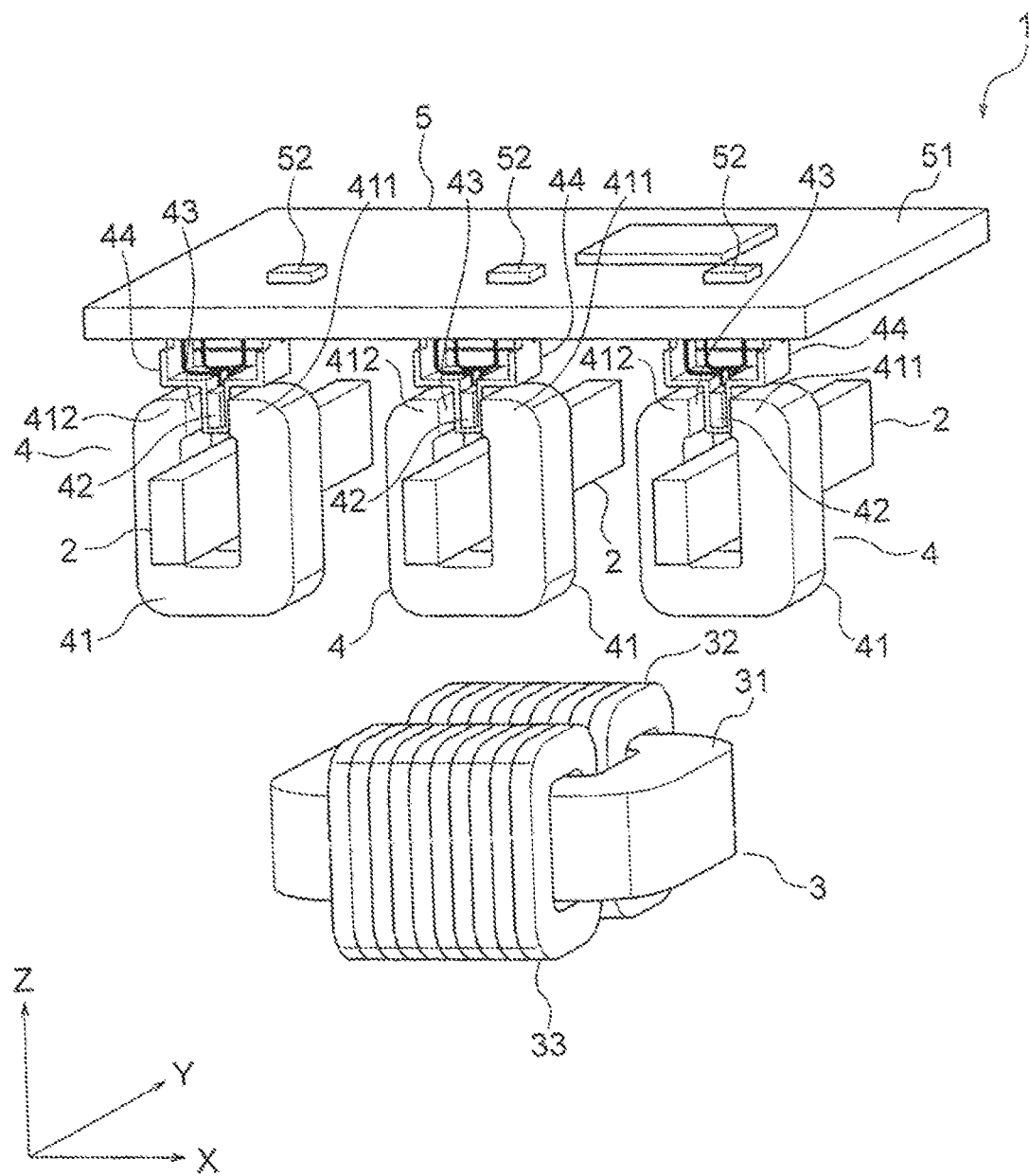
FIG. 2 is an oblique projection that shows part of an electric power converting apparatus from FIG. 1.
Figure 3:
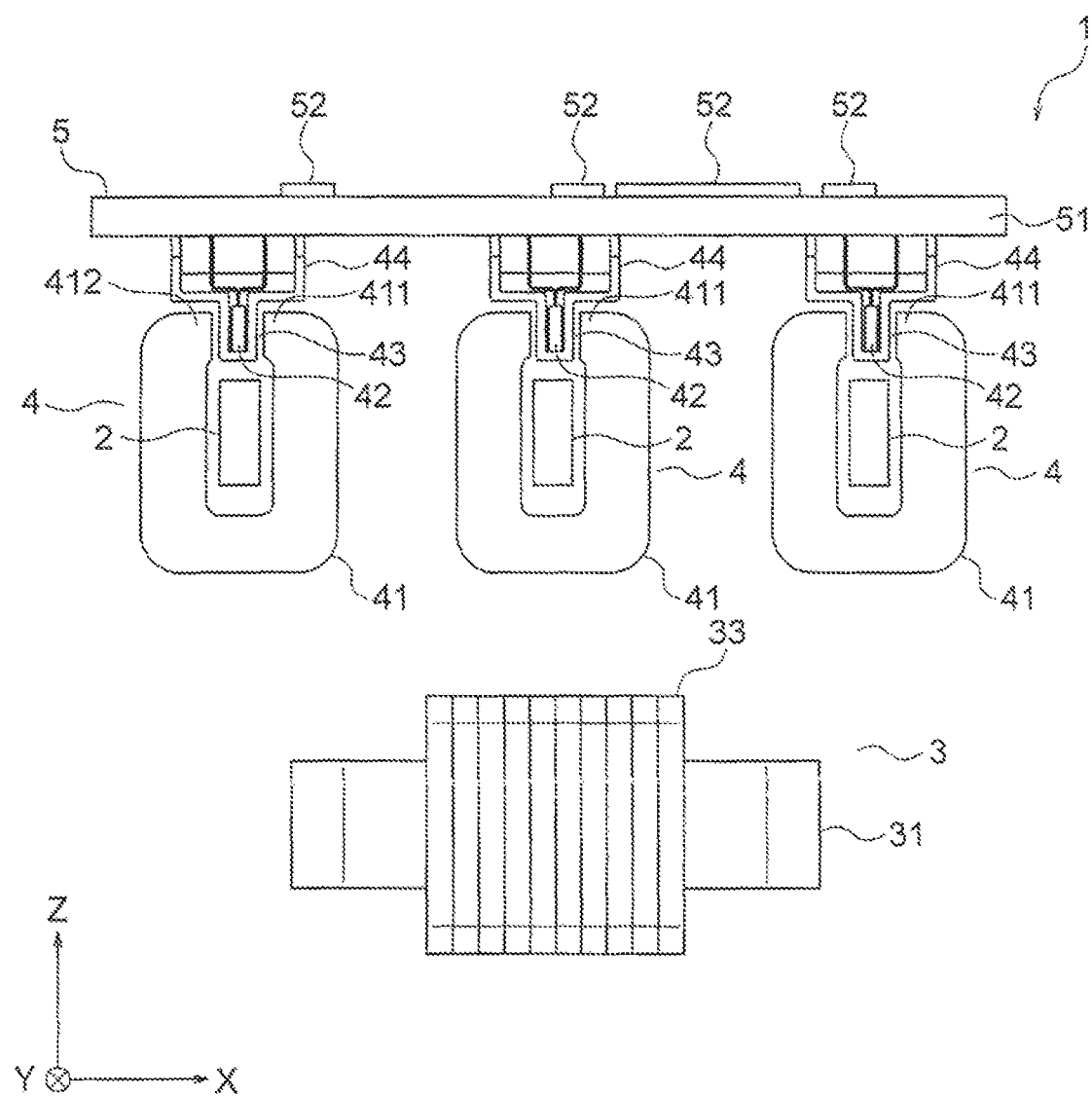
FIG. 3 is a front elevation that shows part of the electric power converting apparatus from FIG. 1.

FIG. 2 is an oblique projection that shows part of the electric power converting apparatus 1 from FIG. 1. FIG. 3 is a front elevation that shows part of the electric power converting apparatus 1 from FIG. 2. The plurality of busbars 2 of the first inverter 101 are lined up so as to be spaced apart from each other in an X direction. Each of the busbars 2 is disposed so as to be parallel to a Y direction that is perpendicular to the X direction. In this example, the number of busbars 2 is three. Furthermore, in this example, the cross-sectional shape of each of the busbars 2 is an oblong. The plurality of busbars 2 are lined up such that a direction that is parallel to short sides of the oblong cross sections is oriented in the X direction. Each of the busbars 2 is constituted by a material that conducts electricity. A metal material that has low electric resistivity such as copper, aluminum, etc., is used as the material that constitutes each of the busbars 2.

The plurality of electric current sensors 4 of the first inverter 101 are disposed separately on each of the plurality of busbars 2. The plurality of electric current sensors 4 thereby measure the electric currents that flow through each of the plurality of busbars 2 separately. Each of the electric current sensors 4 includes a magnetic flux concentrating core 41, and a magnetoelectric transducer 42.

The magnetic flux concentrating core 41 is supported by a supporting construction portion (not shown). A measuring space 43 is disposed in the magnetic flux concentrating core 41. The magnetic flux concentrating core 41 includes: a first end portion 411 and a second end portion 412 that face each other so as to have the measuring space 43 interposed. The magnetic flux concentrating core 41 is a magnetic body that has a shape that surrounds a vicinity of the busbar 2 from the first end portion 411 to the second end portion 412. Consequently, the busbar 2 is passed through the space that is surrounded by the magnetic flux concentrating core 41. In this example, the shape of the magnetic flux concentrating core 41 is a C shape. Moreover, the shape of the magnetic flux concentrating core 41 may alternatively be a U shape.

The magnetic flux concentrating core 41 is constituted by a ferromagnetic material that contains iron, nickel, cobalt, etc. It is desirable for the material of the magnetic flux concentrating core 41 to be a soft magnetic material. Electromagnetic steel sheets, iron, a nickel-iron alloy (such as Permalloy, trademark of the Western Electric Company), ferrite, etc., can be used as the material that constitutes the magnetic flux concentrating core 41.

The first end portion 411 and the second end portion 412 face each other in the X direction. Consequently, the measuring space 43 is open in all directions that are perpendicular to the X direction. In the magnetic flux concentrating core 41, a direction from the busbar 2, through the measuring space 43, and outward from the magnetic flux concentrating core 41 is a "core opening direction". Consequently, in this example, the core opening direction of the magnetic flux concentrating core 41 is aligned with the Z direction which is perpendicular to the X direction and the Y direction. In this example, the core opening directions of all of the plurality of magnetic flux concentrating cores 41 are in an identical direction to each other.

The magnetoelectric transducers 42 are disposed on the controlling circuit board 5 by means of supports 44. In this example, the magnetoelectric transducers 42 are connected to the controlling circuit board 5 by means of a plurality of leads that protrude from the magnetoelectric transducers 42. The supports 44 are made of a material such as a plastic, etc.

Package surfaces are formed on the magnetoelectric transducers 42. The magnetoelectric transducers 42 include a magnetically sensitive portion that senses a magnetic field that passes through the package surface in a specific direction of magnetic sensitivity. In this example, the direction of magnetic sensitivity of the magnetoelectric transducers 42 is a direction that is perpendicular to the package surfaces. The magnetically sensitive portions of the magnetoelectric transducers 42 are disposed in the measuring spaces 43 in a state in which the direction of magnetic sensitivity is aligned with the direction that the first end portion 411 and the second end portion 412 face each other. In this example, the direction of magnetic sensitivity of the magnetically sensitive portions of the magnetoelectric transducers 42 is aligned with the X direction. Consequently, in this example, the direction of magnetic sensitivity of the magnetically sensitive portions of the magnetoelectric transducers 42 is perpendicular to the core opening direction of the magnetic flux concentrating cores 41.

It is desirable for the magnetically sensitive portions of the magnetoelectric transducers 42 to be positioned centrally in the measuring spaces 43. It is particularly desirable for the magnetically sensitive portions of the magnetoelectric transducers 42 to be positioned centrally in the measuring spaces 43 in the X direction. Hall elements, magnetoresistive (MR) elements, etc., can be used as the magnetoelectric transducers 42. Examples of MR elements include anisotropic magnetoresistive (AMR) elements, giant magnetoresistive (GMR) elements, tunnel magnetoresistive (TMR) elements, etc.

When electric current flows through the busbars 2, magnetic fields that are proportional to the electric currents that flow through the busbars 2 are generated around the busbars 2. The magnetic fields that are generated around the busbars 2 pass through the magnetic flux concentrating cores 41 so as to be concentrated in the magnetic flux concentrating cores 41, which are made of a ferromagnetic material. The magnetic fields that pass through the magnetic flux concentrating cores 41 pass through the magnetically sensitive portions of the magnetoelectric transducers 42 that are disposed in the measuring spaces 43. The magnetoelectric transducers 42 generate voltages that corresponds to the magnitude of the magnetic fields that are sensed by the magnetically sensitive portions.

In the electric current sensors 4, magnetic fields other than the magnetic fields that are generated by the electric currents that flow through the busbar 2, i.e., external magnetic fields, are also detected by the magnetically sensitive portions of the magnetoelectric transducers 42. When external magnetic fields are detected by the magnetoelectric transducers 42, measurement errors arise in the electric current sensors 4. In order to suppress measurement errors in the electric current sensors 4, it is necessary to reduce the influence of external magnetic fields on the magnetoelectric transducers 42.

The voltages that are generated in the magnetoelectric transducers 42 are conveyed to the controlling circuit board 5 as signals. The controlling circuit board 5 includes: a circuit board 51, and a plurality of surface-mounted components 52 that are mounted onto the circuit board 51. Parts such as integrated circuits (ICs), resistors, capacitors, etc., are included in the plurality of surface-mounted components 52. A relational expression that converts the magnitude of the magnetic field into an electric current value is set in the ICs that function as the surface-mounted components 52. The controlling circuit board 5 thereby includes: a computing function that computes an electric current value for the electric current that flows through each of the busbars 2 based on the signal from each of the electric current sensors 4; and a controlling function that controls the electric current that flows through each of the busbars 2 based on the electric current value that is obtained by the computation. The controlling circuit board 5 thereby controls the electric current that flows through each of the busbars 2 based on the information from each of the electric current sensors 4.

Moreover, the computing function that computes the electric currents that flow through the busbars 2 is not limited to the function in the controlling circuit board 5. For example, ICs that have a computing function that computes the electric currents that flow through the busbars 2 may alternatively be combined with the magnetoelectric transducers 42.

The controlling circuit board 5 is disposed outside the plurality of magnetic flux concentrating cores 41 so as to be perpendicular to the Z direction. The controlling circuit board 5 is disposed nearer to the measuring space 43 than the busbars 2. The magnetoelectric transducers 42 are supported on the circuit board 51 by means of the supports 44 in a state in which the magnetically sensitive portions are disposed in the measuring space 43. In this example, the plurality of magnetoelectric transducers 42 are supported by the shared circuit board 51.

The electric reactor 3 of the converter 103 is disposed so as to be separated from the plurality of magnetic flux concentrating cores 41 in the Z direction. The electric reactor 3 is disposed on an opposite side of the busbars 2 from the measuring space 43. In addition, the electric reactor 3 includes: an annular electric reactor core 31; and a first coil 32 and a second coil 33 that are each disposed on the electric reactor core 31. The electric reactor 3 suppresses pulsation in the electric currents by passing electric currents to the first coil 32 and the second coil 33.

The electric reactor core 31 is constituted by a ferromagnetic material that contains iron, nickel, cobalt, etc. It is desirable for the material of the electric reactor core 31 to be a soft magnetic material. Electromagnetic steel sheets, iron, a nickel-iron alloy (such as Permalloy, trademark of the Western Electric Company), ferrite, etc., can be used as the material that constitutes the electric reactor core 31. In this example, the electric reactor core 31 is made of a material that is similar or identical to that of the magnetic flux concentrating cores 41.

An annular body that is configured using a single member may alternatively be used as the electric reactor core 31. An assemblage that is assembled by lining up a plurality of core members into an annular shape may alternatively be used as the electric reactor core 31. For example, an assemblage that is assembled into an annular shape by disposing two U-shaped core members so as to face each other may alternatively be used as the electric reactor core 31. An assemblage in which two U-shaped core members and two I-shaped core members are assembled so as to form an annular shape may alternatively be used as the electric reactor core 31.

Figure 4:
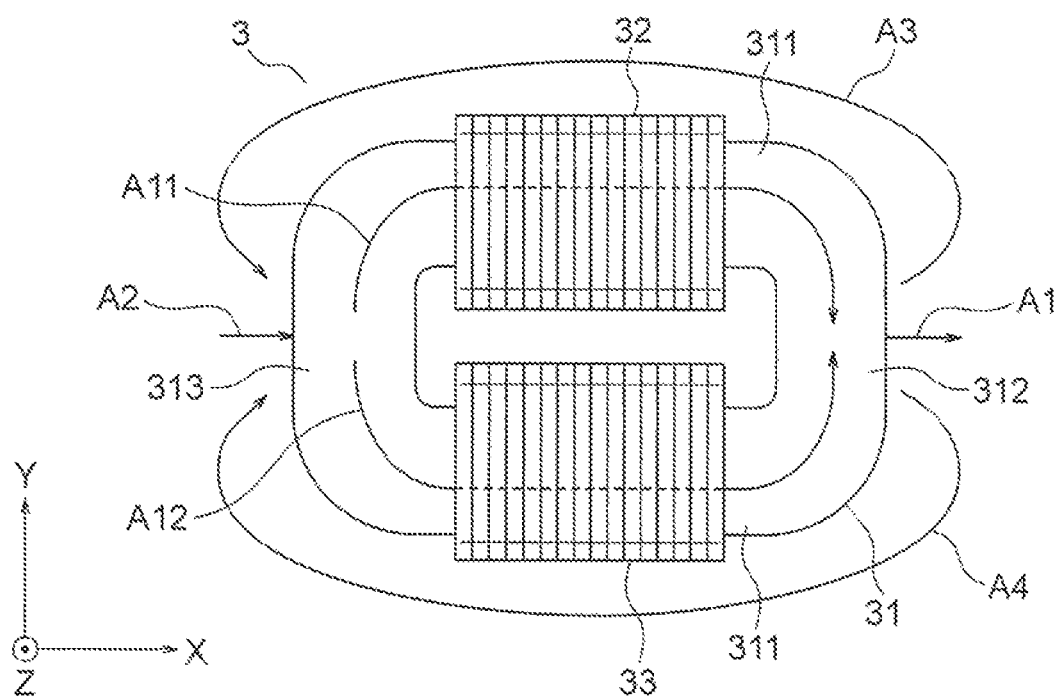
FIG. 4 is a front elevation that shows an electric reactor from FIG. 2.
Figure 5:
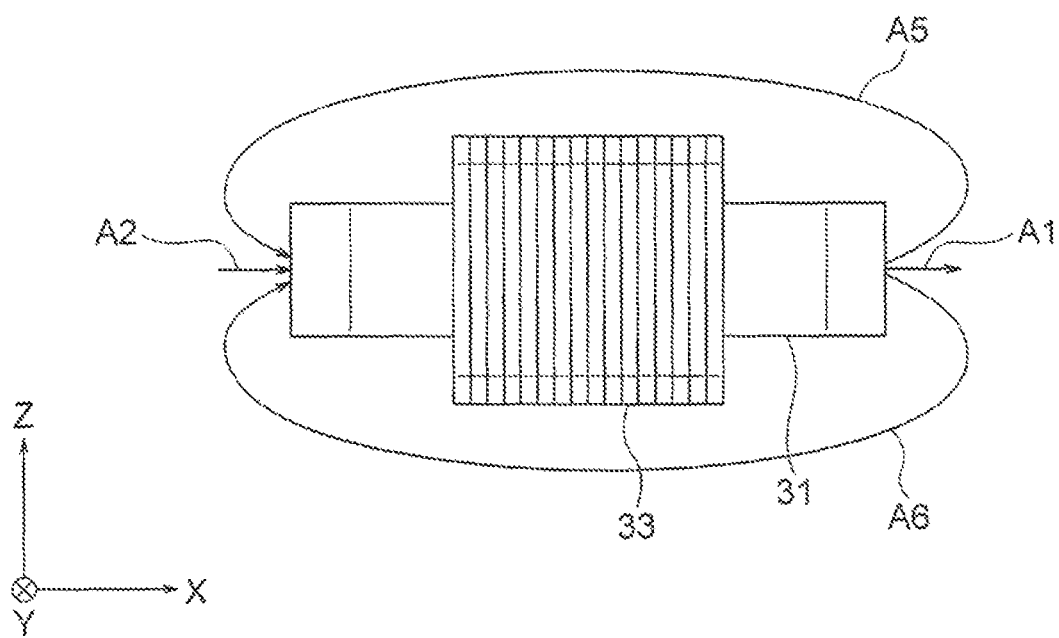
FIG. 5 is a side elevation that shows the electric reactor from FIG. 4.

FIG. 4 is a front elevation that shows the electric reactor 3 from FIG. 2. FIG. 5 is a side elevation that shows the electric reactor 3 from FIG. 4. The annular electric reactor core 31 includes: a pair of core rectilinear portions 311 that are mutually parallel; a first core curved portion 312 that joins together first end portions of the pair of core rectilinear portions 311; and a second core curved portion 313 that joins together second end portions of the pair of core rectilinear portions 311. In this example, the pair of core rectilinear portions 311, which are respectively disposed so as to be parallel to the X direction, are lined up so as to be spaced apart from each other in the Y direction.

Among the pair of core rectilinear portions 311, the first coil 32 is disposed on a first core rectilinear portion 311, and the second coil 33 is disposed on a second core rectilinear portion 311. The first coil 32 and the second coil 33 are mutually independent coils. Mutually separate electric currents can thereby be passed through the first coil 32 and the second coil 33.

When an electric current flows through the first coil 32, a first magnetic field arises that passes through the electric reactor core 31 in a direction of arrow A11 in FIG. 4. When an electric current flows through the second coil 33, a second magnetic field arises that passes through the electric reactor core 31 in a direction of arrow A12 in FIG. 4. In other words, in the electric reactor core 31, the direction of the first magnetic field that is generated by the electric current that flows through the first coil 32 and the direction of the second magnetic field that is generated by the electric current that flows through the second coil 33 are in opposite directions to each other.

The first magnetic field and the second magnetic field leak out as a magnetic leakage field in the direction of arrow A1 outside the electric reactor core 31 by colliding in the first core curved portion 312. The magnetic leakage field that has leaked out in the direction of the arrow A1 outside the electric reactor core 31, passes along the pathways of arrow A3, arrow A4, arrow A5, or arrow A6, and enters the second core curved portion 313 from a direction of arrow A2. In this example, the direction of the arrow A1 and the direction of the arrow A2 are aligned with a +X direction. A +X-direction component of the magnetic leakage field is thereby increased in a portion in which the magnetic leakage field leaks out from the first core curved portion 312 and a portion in which the magnetic leakage field enters the second core curved portion 313. −X-direction components of the magnetic leakage fields are increased around both the first coil 32 and the second coil 33.

Consequently, in the electric reactor 3, when electric currents flow through both the first coil 32 and the second coil 33, a magnetic leakage portion is formed in the first core curved portion 312, where the first magnetic field and the second magnetic field collide and a magnetic leakage field leaks out, and a magnetic entry portion is formed in the second core curved portion 313, where the magnetic leakage field enters on an opposite side from the magnetic leakage portion. The direction of the magnetic leakage field in the electric reactor 3 is a direction that is parallel to a straight line that joins the magnetic leakage portion and the magnetic entry portion that are formed on the electric reactor 3, or a direction along a straight line that is parallel to that straight line. Thus, in this example, the direction of the magnetic leakage field in the electric reactor 3 is aligned with the X direction.

The direction of the magnetic leakage field in the electric reactor 3 is a direction that is different than the core opening direction of the magnetic flux concentrating cores 41. In this example, the core opening direction of the magnetic flux concentrating cores 41 is aligned with the Z direction. Consequently, in this example, the direction of the magnetic leakage field in the electric reactor 3 is a direction that is perpendicular to the core opening direction of the magnetic flux concentrating cores 41. Each of the electric current sensors 4 is disposed within a range that is reached by the magnetic leakage field that leaks out from the electric reactor 3 as an external magnetic field.

Figure 6:
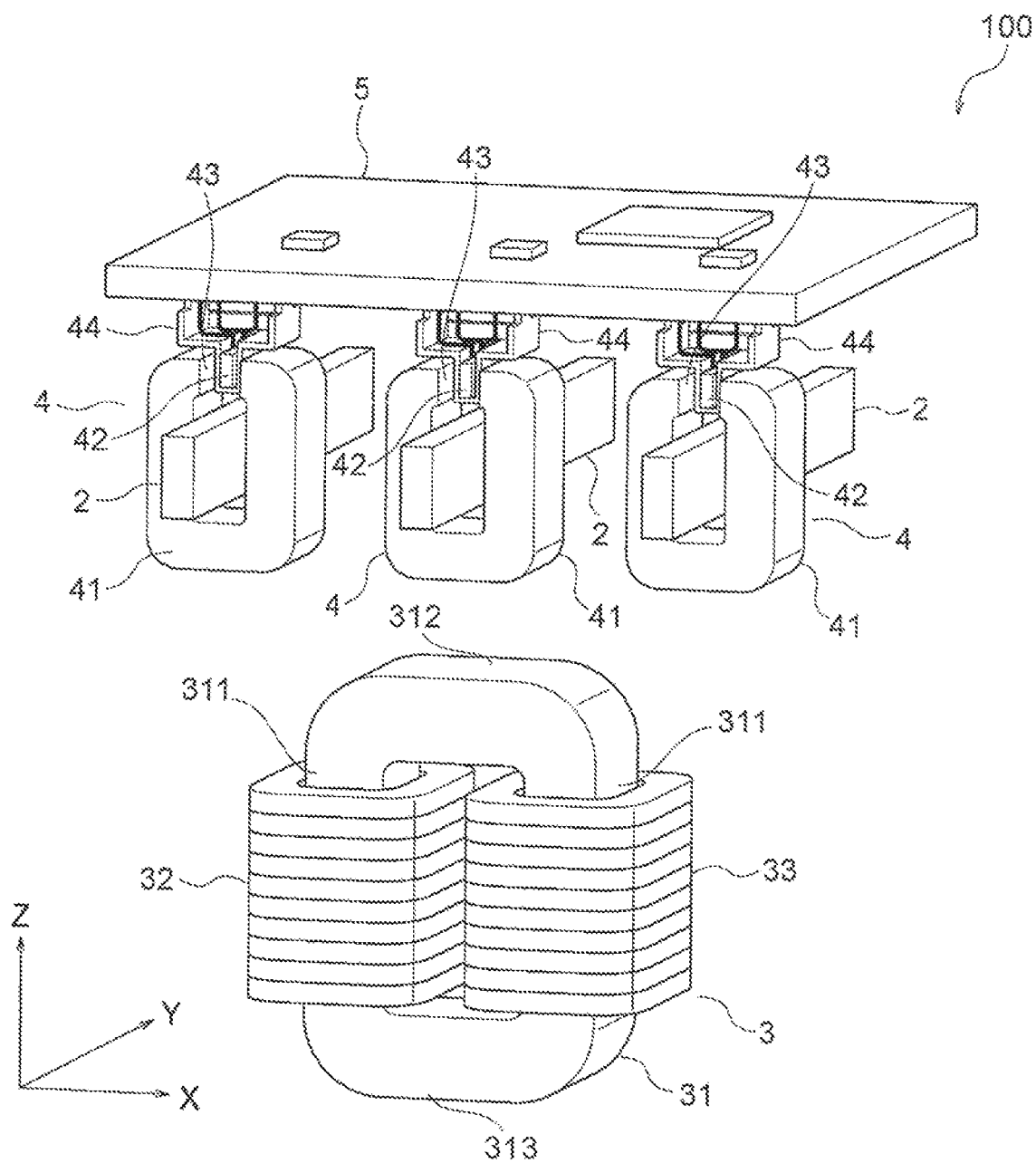
FIG. 6 is an oblique projection that shows an electric power converting apparatus according to a comparative example.

Next, a comparative example for comparison with the electric power converting apparatus 1 according to Embodiment 1 will be explained. FIG. 6 is an oblique projection that shows an electric power converting apparatus according to the comparative example. In the electric power converting apparatus 100 according to the comparative example, orientation of an electric reactor 3 relative to electric current sensors 4 is different than in Embodiment 1.

In the comparative example, a pair of core rectilinear portions 311, which are respectively disposed so as to be parallel to the Z direction, are lined up so as to be spaced apart from each other in the X direction. Thus, in the comparative example, an electric reactor core 31 is disposed such that a first core curved portion 312 faces toward the electric current sensors 4.

Figure 7:
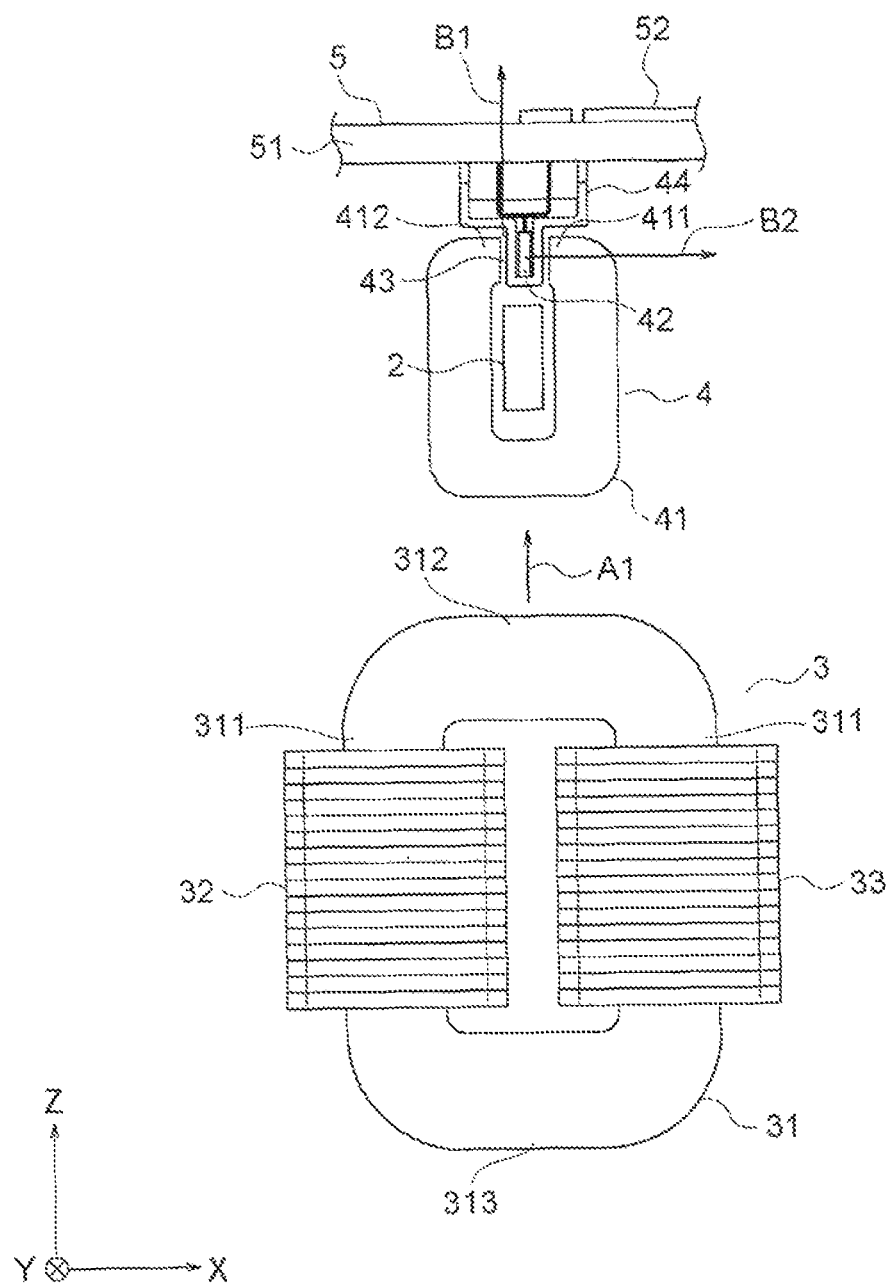
FIG. 7 is a front elevation that shows the electric power converting apparatus according to the comparative example in FIG. 6.

FIG. 7 is a front elevation that shows the electric power converting apparatus according to the comparative example in FIG. 6. In the comparative example, the direction A1 of the magnetic leakage field in the electric reactor 3 and the core opening directions B1 of the magnetic flux concentrating cores 41 are aligned with the Z direction. In the comparative example, the direction of magnetic sensitivity B2 of the magnetically sensitive portions of the magnetoelectric transducers 42 is aligned with the X direction. A remainder of the configuration is similar or identical to that of Embodiment 1.

The positions of the magnetoelectric transducers 42 relative to the magnetic flux concentrating cores 41 may be displaced from the designed positions by assembly errors during manufacturing. In the comparative example, if the positions of the magnetoelectric transducers 42 relative to the magnetic flux concentrating cores 41 are displaced from the designed position, then the influence of the magnetic leakage field of the electric reactor 3 on the magnetoelectric transducers 42 may be increased.

Now, relationships between amounts of positional offset of the magnetoelectric transducers 42 in an X direction and influence of the magnetic leakage field from the electric reactor 3 on the magnetoelectric transducers 42 were compared when there are comparative magnetic flux concentrating cores 41 and when there are no comparative magnetic flux concentrating cores 41. The influence of the magnetic leakage field of the electric reactor 3 on the magnetoelectric transducers 42 was found by a first magnetic field analysis for two cases, i.e., a case in which there were comparative magnetic flux concentrating cores 41, and a case in which there were no comparative magnetic flux concentrating cores.

The first magnetic field analysis was performed by simulating a uniform magnetic field that has a constant magnitude as the magnetic leakage field from the electric reactor 3 in an analytic model. The first magnetic field analysis uses an analytic model in which a center position of the measuring space 43 is aligned with the X direction at a position of a central axis of the electric reactor 3 that is parallel to the Z direction. In addition, in the analytic model of the first magnetic field analysis, the amounts (mm) that the positions of the magnetoelectric transducers 42 are offset in the X direction relative to the central axis of the electric reactor 3 that is parallel to the Z direction is designated as the amount of positional offset (mm) of the magnetoelectric transducers 42 in the X direction.

Figure 8:
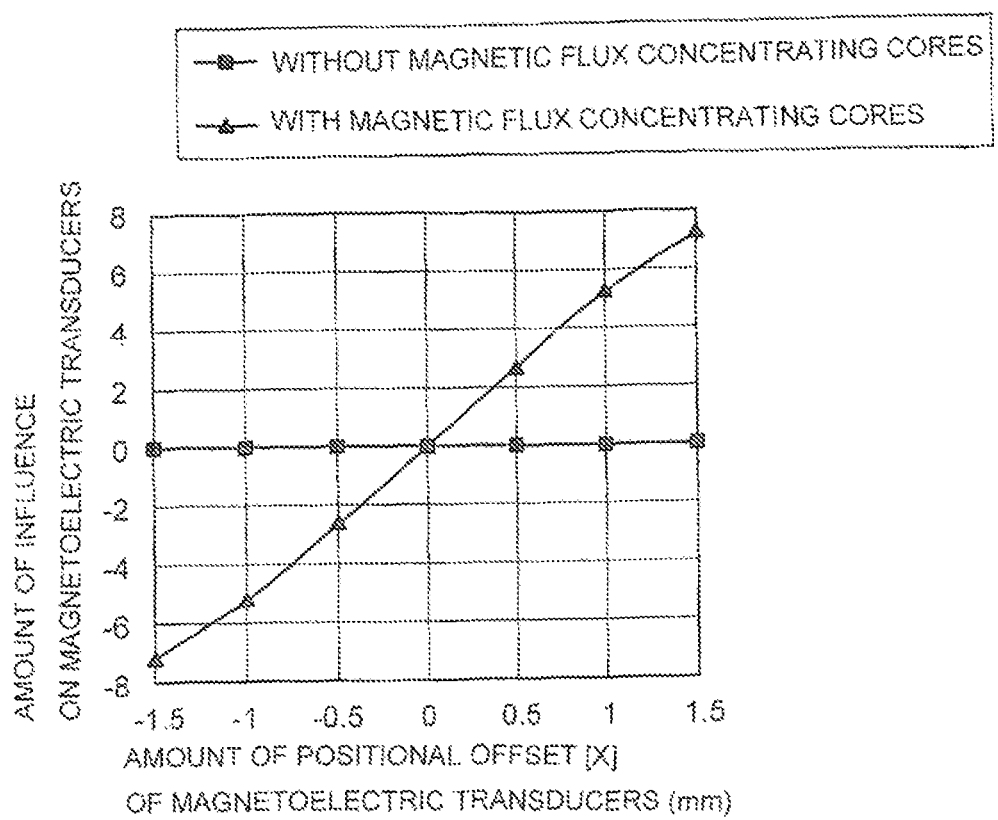
FIG. 8 is a graph in which relationships between amounts of positional offset of magnetoelectric transducers in an X direction and influence of a magnetic leakage field from the electric reactor on the magnetoelectric transducers are compared when there are comparative magnetic flux concentrating cores and when there are no comparative magnetic flux concentrating cores.

FIG. 8 is a graph in which relationships between the amount of positional offset of the magnetoelectric transducers 42 in the X direction and the influence of the magnetic leakage field from the electric reactor 3 on the magnetoelectric transducers 42 are compared when there are comparative magnetic flux concentrating cores 41 and when there are no comparative magnetic flux concentrating cores 41. As shown in FIG. 8, it can be seen that when there is no misalignment of the magnetoelectric transducers 42 in the X direction, there is no influence on the magnetoelectric transducers 42 irrespective of the presence or absence of the magnetic flux concentrating cores 41. However, it can be seen that when there are magnetic flux concentrating cores 41, if the position of the magnetoelectric transducers 42 are displaced even slightly in the X direction, the influence of the magnetic leakage field of the electric reactor 3 on the magnetoelectric transducers 42 is increased.

The positions of the magnetoelectric transducers 42 relative to the magnetic flux concentrating cores 41 may be displaced from the designed position by assembly errors during manufacturing. Consequently, in the comparative example, in which the direction A1 of the magnetic leakage field in the electric reactor 3 is aligned with the core opening directions B1 of the magnetic flux concentrating cores 41, it can be seen that the influence that the magnetic leakage field of the electric reactor 3 exerts on the magnetoelectric transducers 42 is increased when there are magnetic flux concentrating cores 41.

Now, relationships between amounts of positional offset of the magnetoelectric transducers 42 in the X direction and influence of the magnetic leakage field from the electric reactor 3 on the magnetoelectric transducers 42 were found by a second magnetic field analysis for three cases, i.e., when the direction A1 of the magnetic leakage field in the electric reactor 3 is aligned with the X direction, when it is aligned with the Y direction, and when it is aligned with the Z direction.

The second magnetic field analysis was performed by simulating a uniform magnetic field that has a constant magnitude as the magnetic leakage field from the electric reactor 3 in an analytic model while changing the direction A1 of the magnetic leakage field in the electric reactor 3 separately to the X direction, the Y direction, and the Z direction, respectively. In the analytic model of the second magnetic field analysis, the amount (mm) that the position of the magnetoelectric transducers 42 is offset in the X direction relative to central positions of the measuring spaces 43 is designated as the amount of positional offset (mm) of the magnetoelectric transducers 42 in the X direction.

Figure 9:
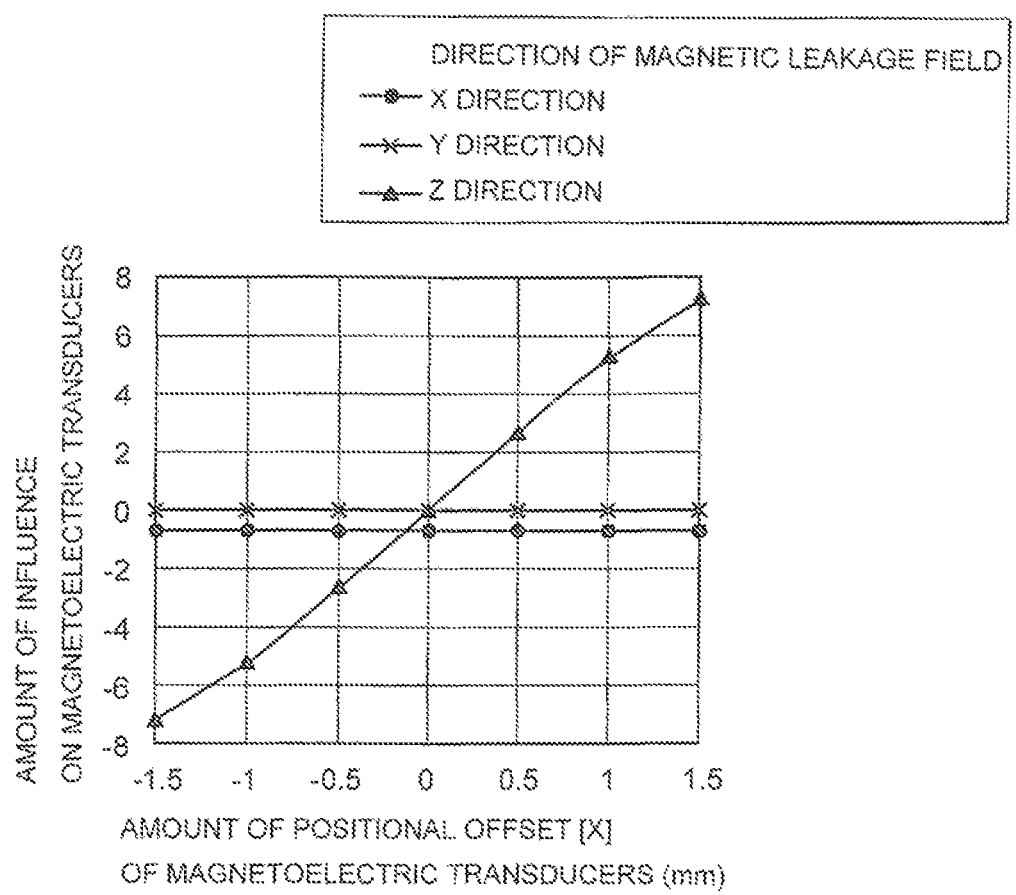
FIG. 9 is a graph in which relationships between amounts of positional offset of the magnetoelectric transducers in an X direction and influence of a magnetic leakage field from the electric reactor on the magnetoelectric transducers are compared in three cases, i.e., when the direction of the magnetic leakage field from the electric reactor is aligned with the X direction, when it is aligned with the Y direction, and when it is aligned with the Z direction.

FIG. 9 is a graph in which relationships between amounts of positional offset of the magnetoelectric transducers 42 in the X direction and influence of the magnetic leakage field from the electric reactor 3 on the magnetoelectric transducers 42 are compared in three cases, i.e., when the direction A1 of the magnetic leakage field from the electric reactor 3 is aligned with the X direction, when it is aligned with the Y direction, and when it is aligned with the Z direction.

As shown in FIG. 9, when the direction A1 of the magnetic leakage field in the electric reactor 3 is aligned with the Z direction, if the position of the magnetoelectric transducers 42 is displaced in the X direction, the influence of the magnetic leakage field of the electric reactor 3 on the magnetoelectric transducers 42 is increased. Consequently, when the direction A1 of the magnetic leakage field in the electric reactor 3 is aligned with the core opening directions B1 of the magnetic flux concentrating cores 41, as in the comparative example, it can be seen that the influence of the magnetic leakage field of the electric reactor 3 on the magnetoelectric transducers 42 increases as the amount of positional offset of the magnetoelectric transducers 42 in the X direction increases.

In contrast to that, it was found that when the direction A1 of the magnetic leakage field in the electric reactor 3 is aligned with either the X direction or the Y direction, the influence of the magnetic leakage field of the electric reactor 3 on the magnetoelectric transducers 42 was small even if the positions of the magnetoelectric transducers 42 were displaced in the X direction. Consequently, it was found that when the direction A1 of the magnetic leakage field in the electric reactor 3 is a direction that is different than the core opening directions B1 of the magnetic flux concentrating cores 41, the influence of the magnetic leakage field of the electric reactor 3 on the magnetoelectric transducers 42 was small even if the positions of the magnetoelectric transducers 42 were displaced in the X direction.

In the present embodiment, the direction A1 of the magnetic leakage field in the electric reactor 3 is aligned with the X direction, which is different than the core opening directions B1 of the magnetic flux concentrating cores 41. Consequently, in the present embodiment, even if the positions of the magnetoelectric transducers 42 are displaced in the X direction, the influence of the magnetic leakage field of the electric reactor 3 on the magnetoelectric transducers 42 is small.

Moreover, it can be seen from FIG. 9 that when the direction A1 of the magnetic leakage field in the electric reactor 3 is aligned with the X direction, if the positions of the magnetoelectric transducers 42 are displaced even slightly, the magnetoelectric transducers 42 are affected by the magnetic leakage field of the electric reactor 3. However, the influence of the magnetic leakage field of the electric reactor 3 on the magnetoelectric transducers 42 can be suppressed by designing a magnetic shielding effect into the magnetic flux concentrating cores 41.

In an electric power converting apparatus 1 of this kind, the direction A1 of the magnetic leakage field in the electric reactor 3 is aligned with the X direction, and the core opening directions B1 of the magnetic flux concentrating cores 41 are aligned with the Z direction. Because of that, the direction A1 of the magnetic leakage field in the electric reactor 3 can be made a direction that is different than the core opening directions B1 of the magnetic flux concentrating cores 41. Thus, even if the magnetic flux concentrating cores 41 are included in the electric current sensors 4, the magnetic leakage field of the electric reactor 3 can be made less likely to accumulate in the magnetic flux concentrating cores 41. Consequently, even if the positions of the magnetoelectric transducers 42 are offset from the center positions of the measuring spaces 43, the influence of the magnetic leakage field from the electric reactor 3 on the magnetoelectric transducers 42 can be reduced. In other words, measurement errors in the electric current sensors 4 due to misalignment of the magnetoelectric transducers 42 can be suppressed even if electric current sensors 4 that include magnetic flux concentrating cores 41 and magnetoelectric transducers 42 are used.

The direction A1 of the magnetic leakage field in the electric reactor 3 is a direction that is perpendicular to the core opening directions B1 of the magnetic flux concentrating cores 41. Because of that, passage of the magnetic leakage field from the electric reactor 3 through the magnetic flux concentrating cores 41 can be even more reliably suppressed, enabling measurement errors in the electric current sensors 4 to be even more reliably suppressed.

The core opening directions B1 of all of the plurality of magnetic flux concentrating cores 41 are in an identical direction to each other. Because of that, the core opening directions B1 of all of the magnetic flux concentrating cores 41 can be aligned relative to the electric reactor 3. Adjustment of the direction A1 of the magnetic leakage field in the electric reactor 3 can be facilitated. Thus, even if a plurality of electric current sensors 4 are lined up in order to pass a three-phase alternating current, the influence of the magnetic leakage field of the electric reactor 3 on the magnetoelectric transducers 42 can be suppressed in each of the electric current sensors 4.

The magnetoelectric transducers 42 are disposed on the controlling circuit board 5 that controls the electric currents that flow through the busbars 2. Because of that, the controlling circuit board 5 can be used both for controlling the electric currents that flow through the busbars 2, and for supporting the magnetoelectric transducers 42. Thus, the number of parts can be reduced, enabling reductions in the size of the electric power converting apparatus 1 and reductions in cost to be achieved.

The magnetoelectric transducers 42 are disposed centrally in the measuring spaces 43 in the direction that the first end portion 411 and the second end portion 412 face each other, i.e., the X direction. Because of that, increases in measurement errors in the electric current sensors 4 can be suppressed even if the magnetic flux concentrating cores 41 are subjected to external magnetic fields in directions that are similar or identical to the core opening directions B1 of the magnetic flux concentrating cores 41.

The shapes of the magnetic flux concentrating cores 41 are C shapes or U shapes. Because of that, manufacturing and installation of the magnetic flux concentrating cores 41 can be facilitated.

Figure 10:
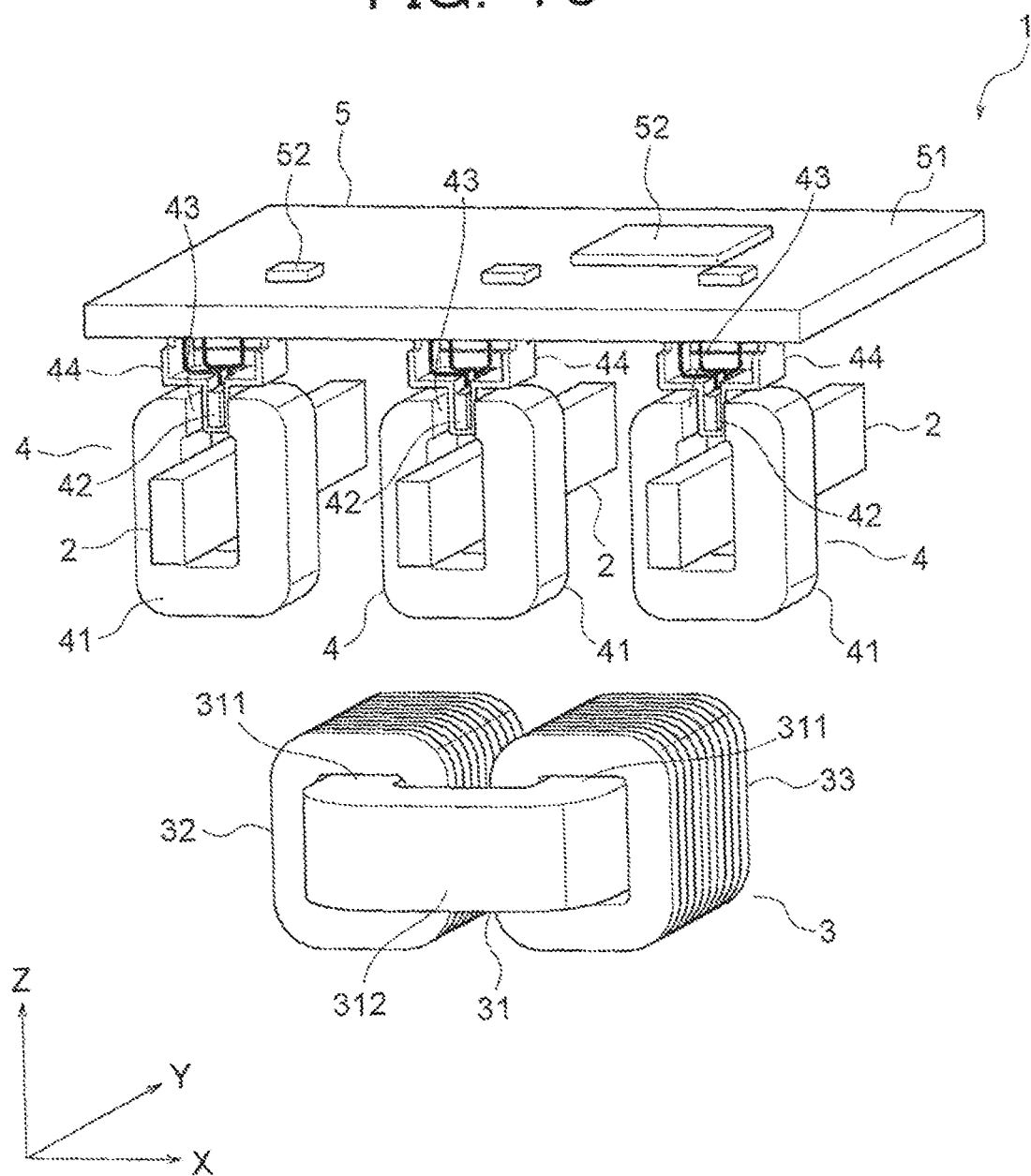
FIG. 10 is an oblique projection that shows another example of an electric power converting apparatus according to Embodiment 1 of the present invention.
Figure 11:
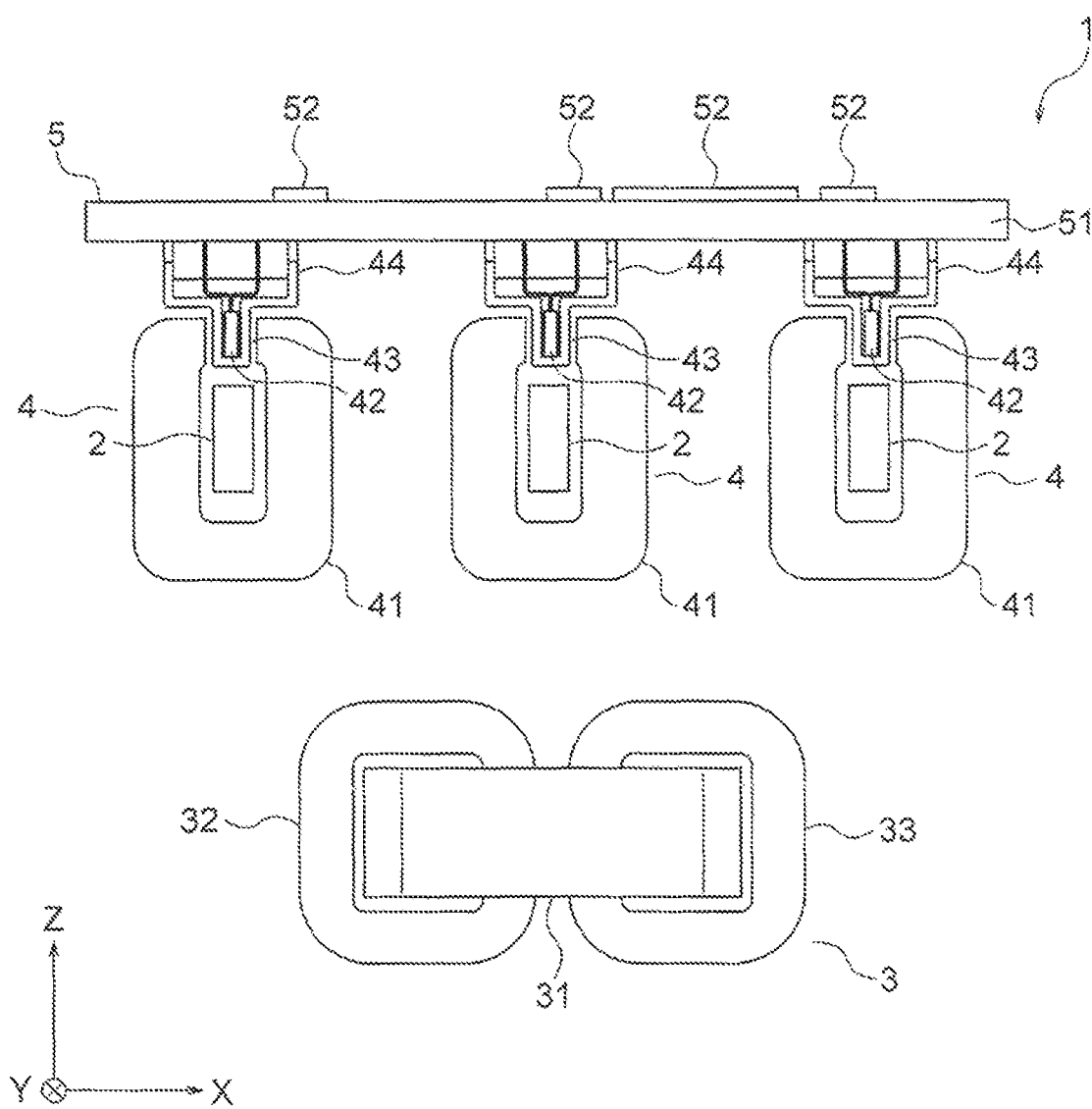
FIG. 11 is a front elevation that shows the electric power converting apparatus from FIG. 10.

Moreover, in Embodiment 1, the direction A1 of the magnetic leakage field in the electric reactor 3 is aligned with the X direction. However, the direction A1 of the magnetic leakage field from the electric reactor 3 is not limited thereto provided that it is a direction that is different than the core opening directions of the magnetic flux concentrating cores 41. For example, as shown in FIGS. 10 and 11, the direction of the magnetic leakage field in the electric reactor 3 may alternatively be aligned with the Y direction. In that case, the electric reactor 3 is disposed in a state in which a pair of core rectilinear portions 311 that are disposed so as to be parallel to the Y direction are lined up so as to be spaced apart from each other in the X direction.

Embodiment 2

Figure 12:
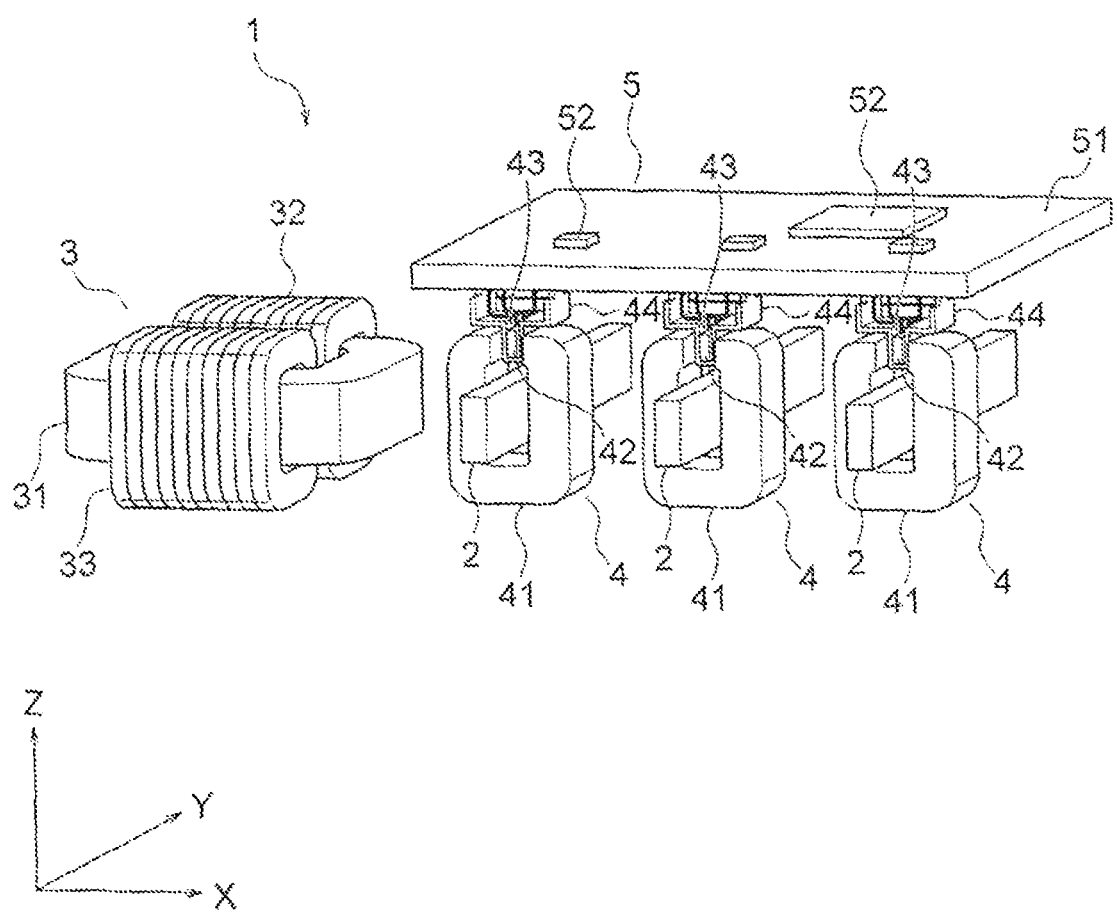
FIG. 12 is an oblique projection that shows an electric power converting apparatus according to Embodiment 2 of the present invention.
Figure 13:
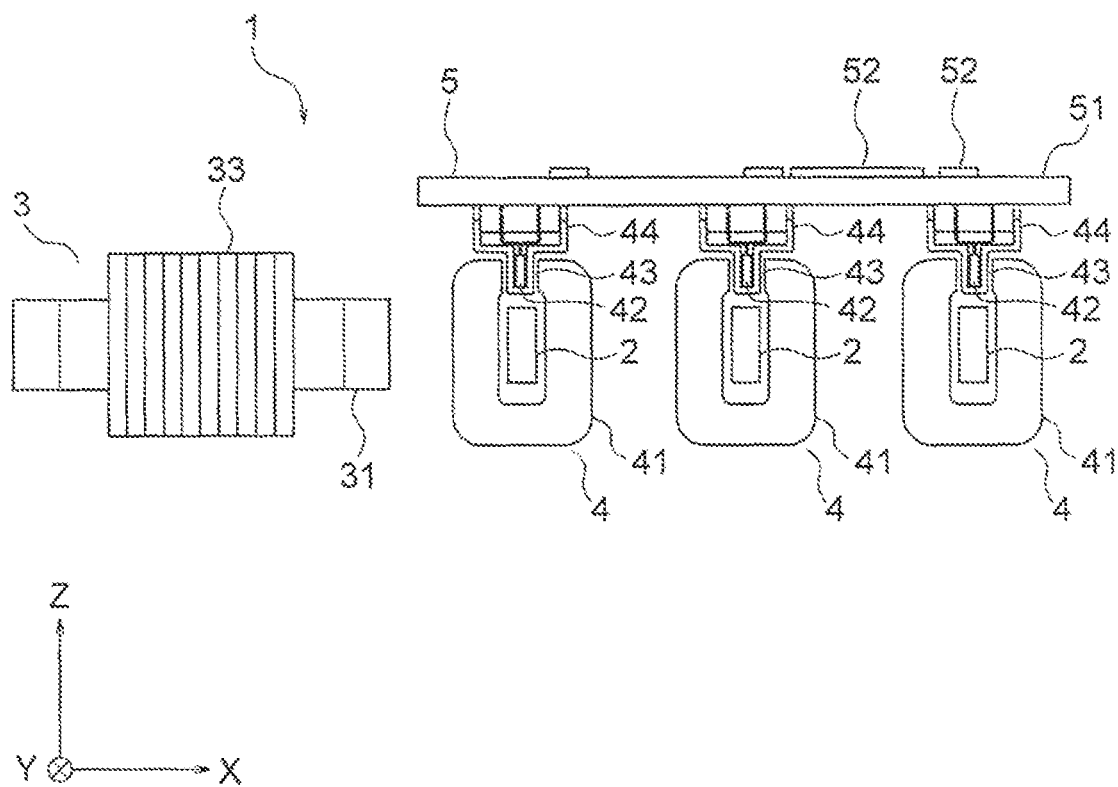
FIG. 13 is a front elevation that shows the electric power converting apparatus from FIG. 12.

FIG. 12 is an oblique projection that shows an electric power converting apparatus according to Embodiment 2 of the present invention. FIG. 13 is a front elevation that shows the electric power converting apparatus from FIG. 12. The electric reactor 3 is disposed in a position that is separated from a plurality of electric current sensors 4 in a direction in which a plurality of busbars 2 line up, that is, in an X direction. At least a portion of the electric reactor 3 overlaps with limits of the plurality of electric current sensors 4 in a direction that is perpendicular to a plane that includes the plurality of busbars 2, that is, in a Z direction.

Configuration and orientation of the electric reactor 3 is similar or identical to those in Embodiment 1. Consequently, a direction A1 of the magnetic leakage field in the electric reactor 3 is a direction that is different than the core opening directions B1 of all of the magnetic flux concentrating cores 41. A remainder of the configuration is similar or identical to that of Embodiment 1.

In an electric power converting apparatus 1 of this kind, at least a portion of the electric reactor 3 overlaps with the limits of the plurality of electric current sensors 4 in the Z direction. Because of that, dimensions of the limits in the Z direction that are necessary for disposing the electric reactor 3 and the plurality of electric current sensors 4 can be reduced. Reductions in size of the electric power converting apparatus 1 in the Z direction can thereby be achieved.

Embodiment 3

Figure 14:
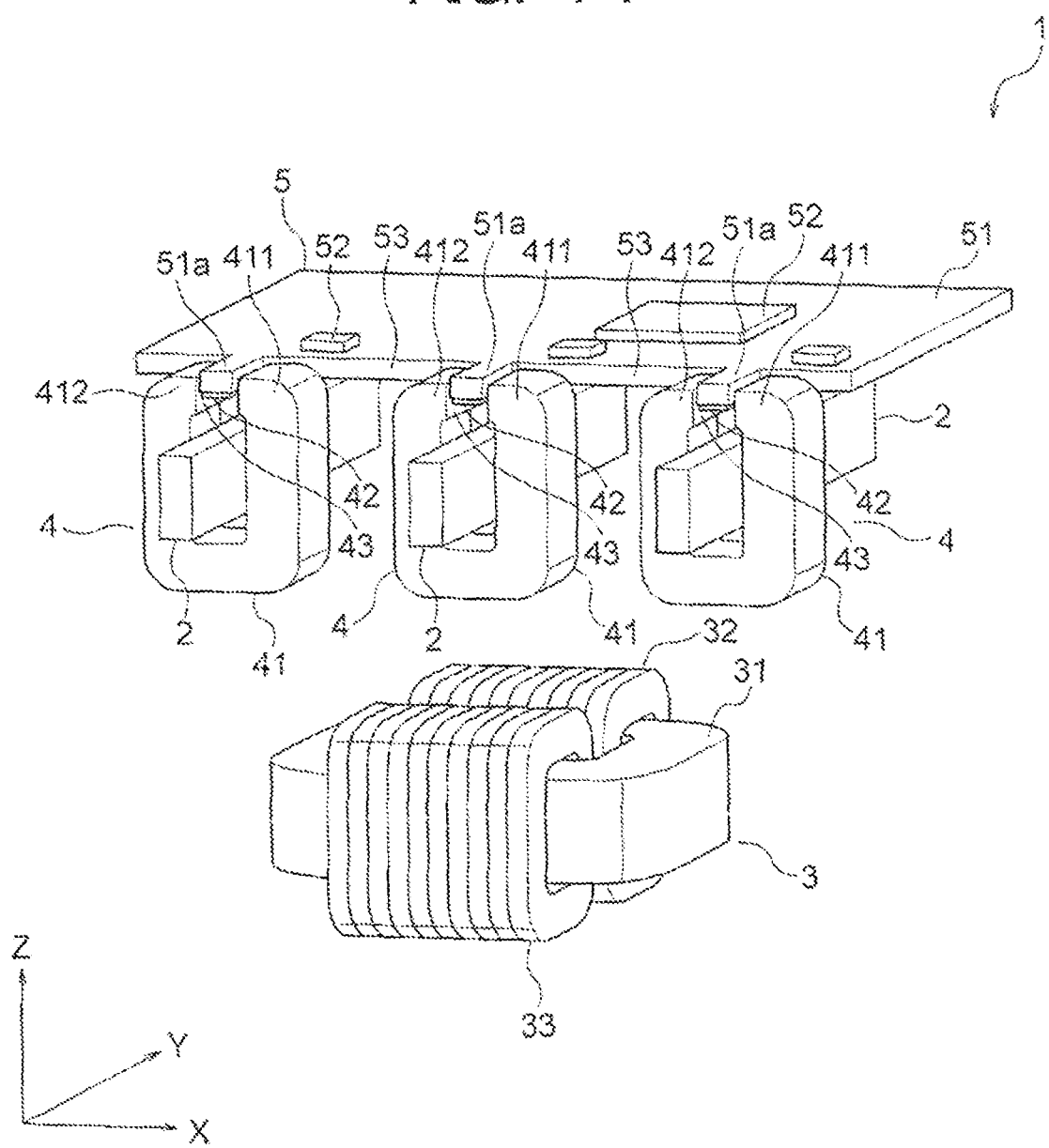
FIG. 14 is an oblique projection that shows an electric power converting apparatus according to Embodiment 3 of the present invention.
Figure 15:
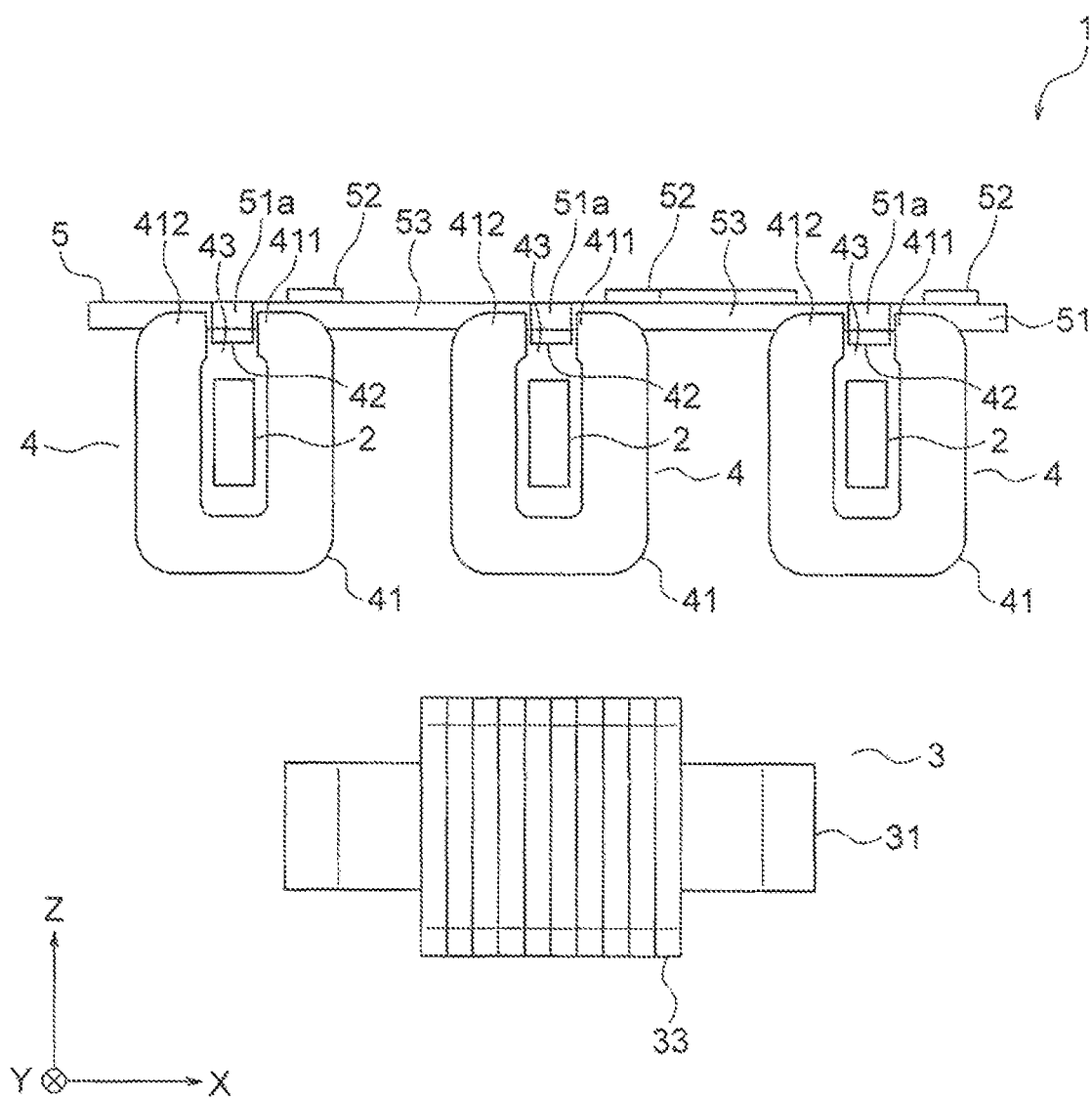
FIG. 15 is a front elevation that shows the electric power converting apparatus from FIG. 14.

FIG. 14 is an oblique projection that shows an electric power converting apparatus according to Embodiment 3 of the present invention. FIG. 15 is a front elevation that shows the electric power converting apparatus from FIG. 14. A plurality of notch portions 53 are formed on an edge portion of a circuit board 51 that is parallel to an X direction. A portion of the circuit board 51 is thereby disposed as a plurality of projecting portions 51a between the plurality of notch portions 53. The plurality of projecting portions 51a are disposed so as to be spaced apart from each other in the X direction so as to be aligned with positions of a plurality of busbars 2.

Magnetic flux concentrating cores 41 are disposed in a state in which first end portions 411 and second end portions 412 are inserted into the notch portions 53. The plurality of projecting portions 51*a* are thereby inserted individually into a measuring space 43 of each of the magnetic flux concentrating cores 41.

Magnetoelectric transducers 42 are surface-mounted elements that are mounted directly onto a surface of the circuit board 51. The magnetoelectric transducers 42 are mounted directly to each of the plurality of projecting portions 51*a*. Magnetically sensitive portions of each of the magnetoelectric transducers 42 are thereby disposed individually in the measuring space 43 of each of the magnetic flux concentrating cores 41.

In this example, the direction of magnetic sensitivity B2 of the magnetoelectric transducers 42 is a direction that is parallel to the package surfaces of the magnetoelectric transducers 42. The magnetically sensitive portions of the magnetoelectric transducers 42 are disposed in the measuring spaces 43 in a state in which the direction of magnetic sensitivity B2 is aligned in the direction that the first end portion 411 and the second end portion 412 face each other, that is, in the X direction. Consequently, in this example, the direction of magnetic sensitivity B2 of the magnetically sensitive portions of the magnetoelectric transducers 42 is perpendicular to the core opening directions B1 of the magnetic flux concentrating cores 41. A remainder of the configuration is similar or identical to that of Embodiment 1.

In an electric power converting apparatus 1 of this kind, the first end portions 411 and the second end portions 412 of the magnetic flux concentrating cores 41 are inserted into the plurality of notch portions 53 that are formed on the controlling circuit board 5. Because of that, the magnetic flux concentrating cores 41 can be moved close to the controlling circuit board 5. Space for disposing the electric current sensors 4 and the controlling circuit board 5 can thereby be reduced in the Z direction, enabling reductions in size of the electric power converting apparatus 1 to be achieved.

Moreover, in Embodiment 3, the plurality of notch portions 53 are formed on the circuit board 51, and the first end portions 411 and the second end portions 412 are inserted into the plurality of notch portions 53. However, a plurality of opening portions may alternatively be formed on the circuit board 51, and the first end portions 411 and the second end portions 412 inserted into the plurality of opening portions. In that case, portions of the circuit board 51 are disposed between the plurality of opening portions as partitioning portions. In that case, the partitioning portions of the circuit board 51 are also inserted into the measuring spaces 43 of the magnetic flux concentrating cores 41. In addition, magnetoelectric transducers 42 are mounted directly onto the partitioning portions of the circuit board 51.

In Embodiment 3, the electric reactor 3 is disposed in a position that is separated from the plurality of electric current sensors 4 in the Z direction. However, the electric reactor 3 may alternatively be disposed in a position that is separated from the plurality of electric current sensors 4 in the X direction, in a similar manner to that of Embodiment 2. In this manner, dimensions of the limits in the Z direction that are necessary for disposing the electric reactor 3 and the plurality of electric current sensors 4 can be further reduced, and reductions in size of the electric power converting apparatus 1 in the Z direction can be further achieved.

In Embodiments 2 and 3, the direction A1 of the magnetic leakage field in the electric reactor 3 is aligned with the X direction. However, in Embodiments 2 and 3, in a similar or identical manner to the orientation of the electric reactor 3 that is shown in FIGS. 10 and 11, the direction of the magnetic leakage field from the electric reactor 3 may alternatively be aligned with the Y direction. In this manner, the direction A1 of the magnetic leakage field in the electric reactor 3 can also be made a direction that is different than the core opening directions B1 of the magnetic flux concentrating cores 41, enabling the influence of the magnetic leakage field from the electric reactor 3 on the magnetoelectric transducers 42 to be reduced.

Embodiment 4

Figure 16:
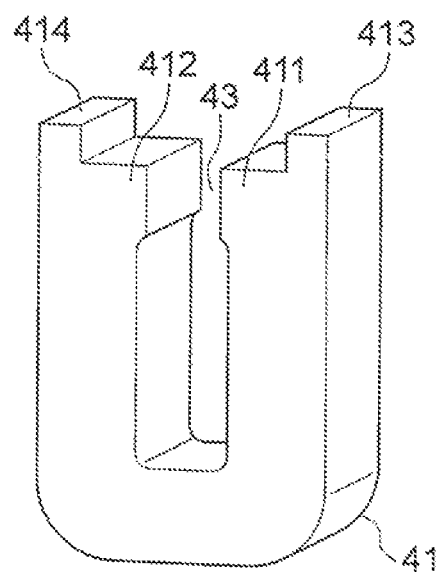
FIG. 16 is an oblique projection that shows a magnetic flux concentrating core of an electric power converting apparatus according to Embodiment 4 of the present invention.

FIG. 16 is an oblique projection that shows a magnetic flux concentrating core of an electric power converting apparatus according to Embodiment 4 of the present invention. A first protruding portion 413 and a second protruding portion 414 are disposed on a magnetic flux concentrating core 41 as a pair of protruding portions. Both the first protruding portion 413 and the second protruding portion 414 are made of a material that is similar or identical to that of the magnetic flux concentrating core 41. The first protruding portion 413 and the second protruding portion 414 may be separate members from the magnetic flux concentrating cores 41, or may be a single member that is integrated with the magnetic flux concentrating core 41.

The first protruding portion 413 protrudes outward from the magnetic flux concentrating core 41 from a first end portion 411. The second protruding portion 414 protrudes outward from the magnetic flux concentrating core 41 from a second end portion 412. The first protruding portion 413 and the second protruding portion 414 protrude outward in an identical direction from the magnetic flux concentrating core 41. In this example, the first protruding portion 413 and the second protruding portion 414 protrude outward from the magnetic flux concentrating core 41 in a similar or identical direction to a core opening direction of the magnetic flux concentrating core 41, that is, in a Z direction. Furthermore, in this example, the respective positions of the first protruding portion 413 and the second protruding portion 414 in the X direction are symmetrical positions relative to a measuring space 43. A remainder of the configuration is similar or identical to that of Embodiment 1.

In an electric power converting apparatus 1 of this kind, the first protruding portion 413 protrudes outward from the magnetic flux concentrating core 41 from the first end portion 411, and the second protruding portion 414 protrudes outward from the magnetic flux concentrating core 41 from the second end portion 412. Because of that, effects that shield the magnetoelectric transducer 42 that is disposed in the measuring space 43 from external magnetic fields can be obtained by the first protruding portion 413 and the second protruding portion 414. The influence of external magnetic fields on the magnetoelectric transducer 42 can thereby be further reduced, enabling measurement errors in the electric current sensor 4 to be further suppressed.

A plurality of indented portions (not shown) into which the first protruding portion 413 and the second protruding portion 414 respectively fit can be disposed on the controlling circuit board 5. Consequently, positioning of the magnetic flux concentrating core 41 relative to the controlling circuit board 5 can be performed easily and more accurately by aligning the first protruding portion 413 and the second protruding portion 414 with the plurality of indented portions. Misalignment of the magnetoelectric transducer 42 in the measuring space 43 can thereby be made less likely to occur, enabling the magnetoelectric transducer 42 to be disposed centrally in the measuring space 43 easily and more accurately. Thus, measurement errors in the electric current sensor 4 can be further suppressed.

Moreover, in Embodiment 4, both the first protruding portion 413 and the second protruding portion 414 are disposed on the magnetic flux concentrating core 41. However, just one protruding portion selected from among the first protruding portion 413 and the second protruding portion 414 may alternatively be disposed on the magnetic flux concentrating core 41. In this manner, effects that shield the magnetoelectric transducer 42 from external magnetic fields can also be obtained by the protruding portion. Furthermore, misalignment of the magnetoelectric transducer 42 in the measuring space 43 can also be made less likely to occur by the protruding portion.

In Embodiment 4, the configuration of the magnetic flux concentrating core 41 on which the first protruding portion 413 and the second protruding portion 414 are disposed has been applied to the magnetic flux concentrating core 41 according to Embodiment 1. However, the configuration of the magnetic flux concentrating core 41 on which the first protruding portion 413 and the second protruding portion 414 are disposed may alternatively be applied to the magnetic flux concentrating cores 41 according to Embodiments 2 and 3.

Embodiment 5

Figure 17:
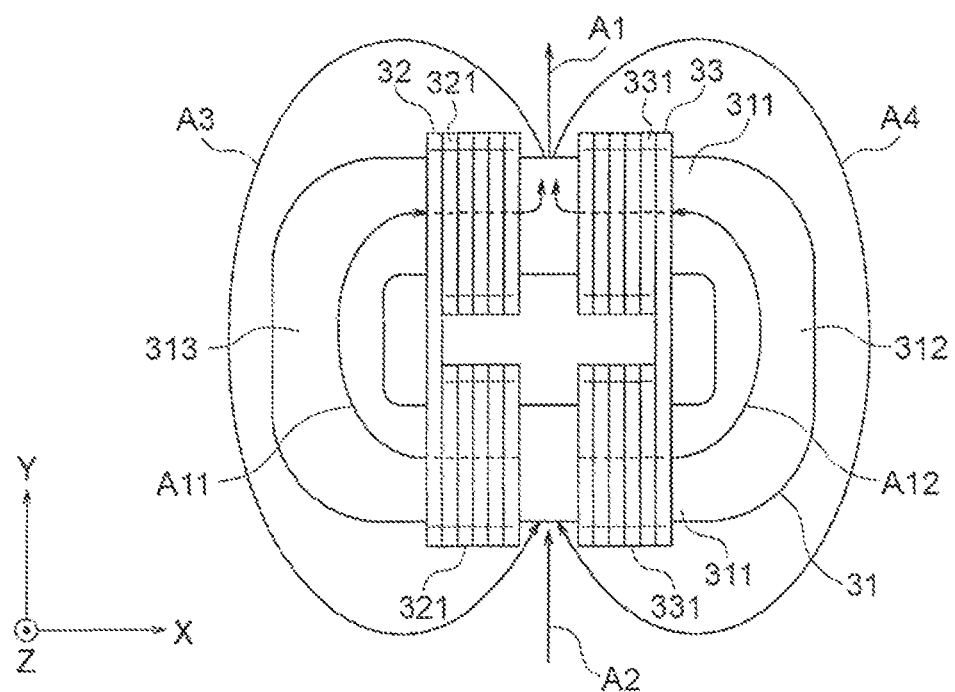
FIG. 17 is a front elevation that shows an electric reactor of an electric power converting apparatus according to Embodiment 5 of the present invention.

FIG. 17 is a front elevation that shows an electric reactor of an electric power converting apparatus according to Embodiment 5 of the present invention. An electric reactor 3 includes: an electric reactor core 31; and a first coil 32 and a second coil 33 that are each disposed on the electric reactor core 31. Configuration of the electric reactor core 31 is similar or identical to the configuration of the electric reactor core 31 according to Embodiment 1.

First and second core rectilinear portions 311 of the electric reactor core 31 are disposed so as to be oriented in an X direction. A first coil 32 and a second coil 33 are disposed so as to be separated from each other in the X direction.

The first coil 32 includes a plurality of the first segmented coil portions 321. In this example, the number of first segmented coil portions 321 is two. The plurality of first segmented coil portions 321 are disposed separately on the first and second core rectilinear portions 311. The plurality of first segmented coil portions 321 are connected to each other electrically.

The second coil 33 includes a plurality of the second segmented coil portions 331. In this example, the number of second segmented coil portions 331 is two. The plurality of second segmented coil portions 331 are disposed separately on the pair of core rectilinear portions 311. The plurality of second segmented coil portions 331 are connected to each other electrically.

When an electric current flows through the first coil 32, a first magnetic field arises that passes through the electric reactor core 31 in a direction of arrow A11 in FIG. 17. When an electric current flows through the second coil 33, a second magnetic field arises that passes through the electric reactor core 31 in a direction of arrow A12 in FIG. 17. In other words, in the electric reactor core 31, the direction of the first magnetic field that is generated by the electric current that flows through the first coil 32 and the direction of the second magnetic field that is generated by the electric current that flows through the second coil 33 are in opposite directions to each other.

The first magnetic field and the second magnetic field leak out as a magnetic leakage field in the direction of arrow A1 outside the electric reactor core 31 by colliding in the first core rectilinear portion 311. The magnetic leakage field that has leaked out in the direction of the arrow A1 outside the electric reactor core 31, passes along the pathways of arrow A3 or arrow A4, and enters the second core rectilinear portion 311 from a direction of arrow A2. In this example, the direction of the arrow A1 and the direction of the arrow A2 are aligned with a +Y direction. A +Y-direction component of the magnetic leakage field is thereby increased in a portion in which the magnetic leakage field leaks out from the first core rectilinear portion 311 and a portion in which the magnetic leakage field enters the second core rectilinear portion 311. −Y-direction components of the magnetic leakage fields are increased around both the first coil 32 and the second coil 33.

Consequently, in the electric reactor 3 according to Embodiment 5, when electric currents flow through both the first coil 32 and the second coil 33, a magnetic leakage portion is formed in the first core rectilinear portion 311, where the first magnetic field and the second magnetic field collide and a magnetic leakage field leaks out, and a magnetic entry portion is formed in the second core rectilinear portion 311, where the magnetic leakage field enters on an opposite side from the magnetic leakage portion. The direction A1 of the magnetic leakage field in the electric reactor 3 is a direction that is parallel to a straight line that joins the magnetic leakage portion and the magnetic entry portion that are formed on the electric reactor 3, or a direction along a straight line that is parallel to that straight line. Thus, in this example, the direction A1 of the magnetic leakage field in the electric reactor 3 is aligned with the Y direction. A remainder of the configuration is similar or identical to that of Embodiment 1.

In an electric power converting apparatus 1 of this kind, the first coil 32 includes a plurality of first segmented coil portions 321, and the second coil 33 includes a plurality of second segmented coil portions 331. In this manner, by making the direction A1 of the magnetic leakage field in the electric reactor 3 a direction that is different than the core opening directions B1 of the magnetic flux concentrating core 41, the influence of the magnetic leakage field from the electric reactor 3 on the magnetoelectric transducers 42 can be reduced, enabling the measurement errors in the electric current sensors 4 to be suppressed.

Moreover, in Embodiment 5, the number of first segmented coil portions 321 is two. However, the number of first segmented coil portions 321 may alternatively be three or more.

In Embodiment 5, the number of second segmented coil portions 331 is two. However, the number of second segmented coil portions 331 may alternatively be three or more.

In Embodiment 5, the first coil 32 that includes the plurality of first segmented coil portions 321 and the second coil 33 that includes the plurality of second segmented coil portions 331 have been applied to the electric reactor 3 according to Embodiment 1. However, the first coil 32 that includes the plurality of first segmented coil portions 321 and the second coil 33 that includes the plurality of second segmented coil portions 331 may alternatively be applied to the electric reactor 3 according to Embodiments 2 through 4.

In each of the above embodiments, a molded member that integrates the magnetic flux concentrating core 41 and the magnetoelectric transducer 42 may alternatively be included in the electric current sensor 4. In that case, the molded member is configured using a resin. In that case, the molded member may fill the measuring space 43, or it may not fill the measuring space 43. In this manner, positioning of the magnetoelectric transducer 42 on the magnetic flux concentrating core 41 can be made even more accurate. Measurement errors in the electric current sensors 4 can thereby be even more reliably suppressed.

In each of the above embodiments, the electric current sensor 4 of the first inverter 101 is disposed in a range that is reached by the magnetic leakage field that leaks out from the electric reactor 3 of the converter 103. However, the electric current sensor 4*a* of the second inverter 102 may alternatively be disposed in the range that is reached by the magnetic leakage field that leaks out from the electric reactor 3, or the electric current sensor 4*b* of the converter 103 may alternatively be disposed there.

What is claimed is:

1. An electric power converting apparatus comprising:
   a busbar;
   an electric reactor; and
   an electric current sensor that is disposed in a range that is reached by a magnetic leakage field that leaks out from the electric reactor, the electric current sensor measuring an electric current that flows through the busbar,
   wherein:
   the electric current sensor comprises:
      a magnetic flux concentrating core that has a first end portion and a second end portion that face each other so as to have a measuring space interposed; and
      a magnetoelectric transducer that has a magnetically sensitive portion that is disposed in the measuring space, the magnetoelectric transducer generating a signal in response to a magnitude of a magnetic field that is sensed by the magnetically sensitive portion; and
   where a core opening direction of the magnetic flux concentrating core is a direction that is directed from the busbar, through the measuring space, and outward from the magnetic flux concentrating core, a direction of the magnetic leakage field at the electric reactor is a direction that is different than the core opening direction, and
   further comprising a controlling circuit board that controls electric current that flows through the busbar based on information from the electric current sensor, the magnetoelectric transducer being disposed on the controlling circuit board.

2. The electric power converting apparatus according to claim 1, wherein the direction of the magnetic leakage field at the electric reactor is a direction that is perpendicular to the core opening direction.

3. The electric power converting apparatus according to claim 1, comprising a plurality of the electric current sensors that separately measure respective electric currents that flow through a plurality of the busbars, the core opening directions of all of the plurality of magnetic flux concentrating cores being a mutually identical direction.

4. The electric power converting apparatus according to claim 1, wherein the magnetically sensitive portion is disposed centrally in the measuring space.

5. The electric power converting apparatus according to claim 1, wherein the electric current sensor comprises a molded member that integrates the magnetic flux concentrating core and the magnetoelectric transducer.

6. The electric power converting apparatus according to claim 1, wherein a protruding portion that protrudes outward from the magnetic flux concentrating core from at least one of the first end portion and the second end portion is disposed on the magnetic flux concentrating core.

* * * * *